United States Patent
Cho et al.

(10) Patent No.: US 10,435,234 B2
(45) Date of Patent: Oct. 8, 2019

(54) CHEMICAL LIQUID SUPPLY APPARATUS AND SEMICONDUCTOR PROCESSING APPARATUS HAVING THE SAME

(71) Applicant: Samsung Electronics Co., Ltd., Suwon-si, Gyeonggi-do (KR)

(72) Inventors: Yong Jhin Cho, Hwaseong-si (KR); In Kwang Bae, Osan-si (KR); Jung Min Oh, Incheon (KR); Mi Hyun Park, Seongnam-si (KR); Kun Tack Lee, Suwon-si (KR); Yong Jun Choi, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/814,842

(22) Filed: Nov. 16, 2017

(65) Prior Publication Data

US 2018/0334318 A1    Nov. 22, 2018

(30) Foreign Application Priority Data

May 18, 2017    (KR) .................. 10-2017-0061842

(51) Int. Cl.
| | |
|---|---|
| *B05B 5/025* | (2006.01) |
| *B05C 11/10* | (2006.01) |
| *B65D 85/00* | (2006.01) |
| *B65D 90/46* | (2006.01) |
| *G01R 29/24* | (2006.01) |

(Continued)

(52) U.S. Cl.
CPC .............. *B65D 85/70* (2013.01); *B05B 5/025* (2013.01); *B05C 11/10* (2013.01); *B65D 90/46* (2013.01); *C08F 14/22* (2013.01); *C08F 14/26* (2013.01); *C08K 3/041* (2017.05); *C08K 3/042* (2017.05); *C08L 27/20* (2013.01); *C09D 5/24* (2013.01); *G01R 29/24* (2013.01);

(Continued)

(58) Field of Classification Search
USPC .... 118/620–640, 52, 56, 612, 319, 320, 712
See application file for complete search history.

(56) References Cited

U.S. PATENT DOCUMENTS

| | | | |
|---|---|---|---|
| 7,927,668 B2 * | 4/2011 | Tanaka .................. | B05C 1/08 |
| | | | 118/407 |
| 9,494,261 B2 | 11/2016 | Pan et al. | |

(Continued)

FOREIGN PATENT DOCUMENTS

| | | |
|---|---|---|
| JP | 2007317821 | 12/2007 |
| JP | 2008030471 | 2/2008 |

(Continued)

OTHER PUBLICATIONS

English Translation JP-2007317821, Dec. 6, 2007.*

*Primary Examiner* — Yewebdar T Tadesse
(74) *Attorney, Agent, or Firm* — Myers Bigel, P.A.

(57) ABSTRACT

A chemical liquid supply apparatus includes a storage container configured to accommodate a chemical liquid for processing a semiconductor substrate, a chemical liquid supply pipe, a supply nozzle, and a grounding conductor. A conductive layer including a non-metallic conductive material is formed on an inner surface of the chemical liquid supply pipe. The supply nozzle includes a non-metallic conductive material. The conductive layer or the supply nozzle is electrically connected to the grounding conductor which is grounded to an outside of the pipe.

13 Claims, 11 Drawing Sheets

(51) Int. Cl.
*C09D 5/24* (2006.01)
*C08L 27/20* (2006.01)
*H01L 21/67* (2006.01)
*C08F 14/26* (2006.01)
*C08K 3/04* (2006.01)
*C08F 14/22* (2006.01)

(52) U.S. Cl.
CPC .... *H01L 21/6708* (2013.01); *H01L 21/67051* (2013.01); *H01L 21/67253* (2013.01)

(56) References Cited

U.S. PATENT DOCUMENTS

2008/0173327 A1* 7/2008 Miyagi ............... B05B 5/03
 134/1.3
2012/0181173 A1* 7/2012 Ochoteco Vaquero ...............
 C12Q 1/001
 204/403.14

FOREIGN PATENT DOCUMENTS

| | | |
|---|---|---|
| JP | 2009189988 | 8/2009 |
| JP | 4738033 | 5/2011 |
| JP | 4986191 | 5/2012 |
| JP | 2013222947 | 10/2013 |
| JP | 5954096 | 6/2016 |

* cited by examiner

US 10,435,234 B2

CHEMICAL LIQUID SUPPLY APPARATUS AND SEMICONDUCTOR PROCESSING APPARATUS HAVING THE SAME

CROSS-REFERENCE TO RELATED APPLICATION

This U.S. non-provisional patent application claims priority under 35 U.S.C. § 119 to and the benefit of Korean Patent Application No. 10-2017-0061842, filed on May 18, 2017, in the Korean Intellectual Property Office (KIPO), the disclosure of which is incorporated herein by reference in its entirety.

BACKGROUND

The present inventive concept relates to a chemical liquid supply apparatus capable of suppressing generation of an electric charge in a chemical liquid flowing in the chemical liquid supply apparatus or removing a generated electric charge therefrom, and a semiconductor processing apparatus having the same.

In a semiconductor manufacturing process, contaminants, such as particles, organic contaminants, and metal contaminants, remaining on a surface of a substrate can greatly affect quality and production yield of a semiconductor device. Therefore, a cleaning process of removing various contaminants attached to a surface of a substrate is very important in the semiconductor manufacturing process, and a process of cleaning the substrate is performed before and after each unit process of manufacturing semiconductor devices.

During the process of cleaning a substrate, a chemical liquid accommodated in a storage container is circulated through a pipe connected to the storage container. When the chemical liquid is circulated, electrostatic induction occurs at the chemical liquid and a liquid-contacting portion of a circulating pipe due to friction between the chemical liquid and the liquid-contacting portion, and an electric charge is generated in the chemical liquid due to the electrostatic induction. When the electrostatically induced chemical liquid is sprayed onto the substrate, particles are adsorbed onto the substrate due to electrostatic attraction generated by an electric charge, and there is a problem that an amount of small-sized particles remaining on the substrate rapidly increases after the cleaning process, and control of such particles is further required as a degree of integration of a semiconductor device is increased.

SUMMARY OF THE INVENTION

The present inventive concept is directed to providing a chemical liquid supply apparatus configured to suppress adsorption of particles onto semiconductor chips during a semiconductor manufacturing process.

According to an example embodiment of the present inventive concept, there is provided a static electricity monitoring system configured to monitor in real time a state of an electric charge in a chemical liquid supply pipe.

According to an example embodiment of the present inventive concept, there is provided a chemical liquid supply pipe configured to reduce and/or remove an electric charge from a chemical liquid during a semiconductor manufacturing process.

A chemical liquid supply apparatus according to an example embodiment of the present inventive concept includes a storage container configured to accommodate a chemical liquid for processing a substrate, a chemical liquid supply pipe connected to the storage container and having a conductive layer including a first non-metallic conductive material, a supply nozzle connected to the chemical liquid supply pipe, configured to supply the chemical liquid to the substrate, and including a second non-metallic conductive material, and a grounding conductor electrically connected to the conductive layer or the supply nozzle. The conductive layer is formed on an inner surface of the chemical liquid supply pipe.

A static electricity monitoring system according to an example embodiment of the present inventive concept includes a chemical liquid supply pipe configured to supply a chemical liquid for processing a substrate, a first static electricity measurement sensor configured to pass through an outer wall of the chemical liquid supply pipe and including a first layer including a first non-conductive material and a second layer including a first non-metallic conductive material, and a grounding conductor electrically connected to the second layer. The first layer is formed on a surface of the first static electricity measurement sensor and the second layer is formed on the first layer.

A pipe configured to supply a chemical liquid for processing a semiconductor substrate according to an example embodiment of the present inventive concept includes a pipe including an inlet for a chemical liquid for processing a substrate, a conductive layer including a first non-metallic conductive material and formed on an inner surface of the pipe, a partition structure including a second non-metallic conductive material and formed to divide an inside of the pipe into a plurality of flow paths defining a plurality of chemical liquid flow portions through which the chemical liquid for processing a substrate flows, and a grounding conductor electrically connected to the partition structure.

BRIEF DESCRIPTION OF THE DRAWINGS

The above and other objects, features and advantages of the present inventive concept will become more apparent to those of ordinary skill in the art by describing example embodiments thereof in detail with reference to the accompanying drawings, in which.

DETAILED DESCRIPTION OF EXAMPLE EMBODIMENTS

First, a semiconductor substrate processing process according to example embodiments of the present inventive concept will be briefly described. In order to manufacture a semiconductor device, various processes, such as photolithography, etching, ashing, ion implanting, thin film deposition, and cleaning processes, are performed on a substrate. The etching process among the above processes is a process of removing an unnecessary region of a thin film formed on the substrate, and a chemical processing process and a rinse processing process are sequentially performed as the etching process of the substrate. In the chemical processing process, a chemical for etching the thin film formed on the substrate is supplied to the substrate, and in the rinse processing process, a rinsing liquid, such as deionized water, is supplied onto the substrate. Also, the cleaning process is a process of removing impurities on the substrate, and deionized water or an organic solvent is supplied as a cleaning liquid thereof.

In the semiconductor substrate processing process, particles generated by semiconductor equipment, an environment, various kinds of gases, a chemical solution, deionized water, or the like may contaminate a surface of a silicon substrate. Contamination due to adsorption of the particles generated as described above may cause pattern defects in the photolithography process, defects such as pinholes and microvoids due to dispersion of the particles in a thin film formation process, defects due to masking in an ion implanting process, defective device qualities which interfere with an operation of the device on a device interconnection, and the like. Also, as the number of the particles increases, a breakdown voltage of an insulating film of a gate oxide film decreases, and thus reliability and a yield thereof may be lowered. Such particles are considered to be one of the factors that have the greatest influence on the yield of a semiconductor device.

In the semiconductor substrate processing process, it is important to remove particles that greatly affect the quality and yield of the semiconductor device. Also, a degree of adsorption of the particles onto the substrate may be increased by electric charges included in a chemical liquid and the substrate. In the case of particles having a size smaller than 26 nm, it is first necessary to reduce or remove an electric charge of a chemical liquid supplied to the substrate because it is not possible to completely remove the electric charge through only a removal method using a chemical filter.

Hereinafter, various embodiments according to the present inventive concept will be described in detail with reference to the accompanying drawings.

Figure 1:
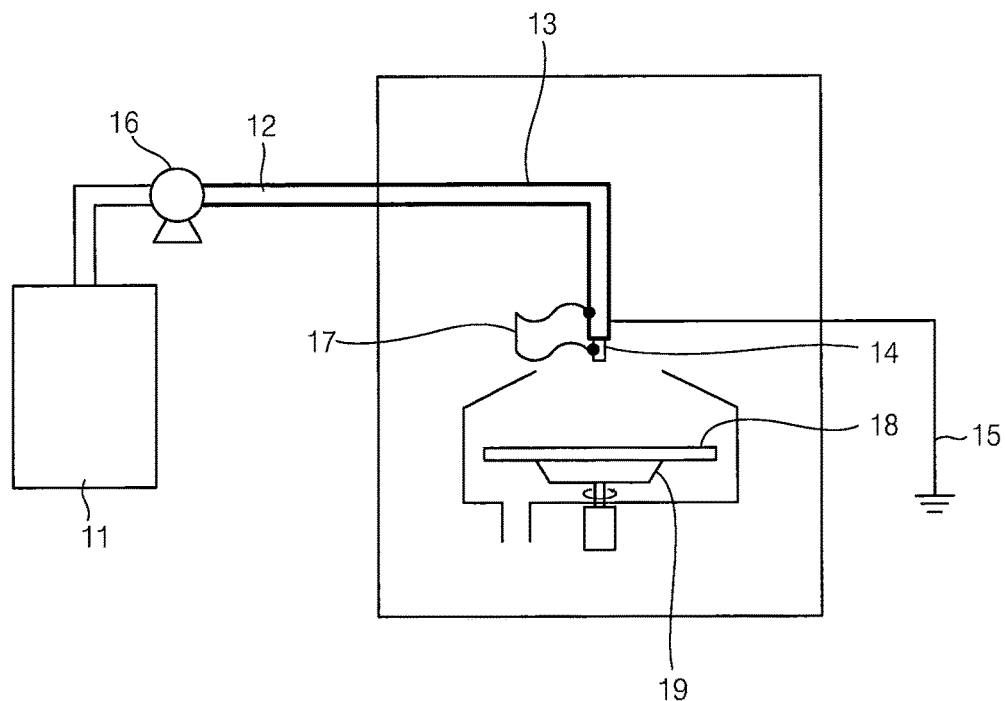
FIG. 1 is a schematic diagram illustrating a substrate processing apparatus including a chemical liquid supply apparatus according to an example embodiment of the present inventive concept.

FIG. 1 is a diagram schematically illustrating a semiconductor substrate processing apparatus including a chemical liquid supply apparatus according to an example embodiment of the present inventive concept.

Referring to FIG. 1, an apparatus configured to supply a chemical liquid for processing a semiconductor substrate may include a storage container 11 in which a chemical liquid for processing a semiconductor is accommodated, a chemical liquid supply pipe 12 connected to the storage container 11, a conductive layer 13 which includes a first non-metallic conductive material and is formed on an inner surface of the chemical liquid supply pipe 12, a supply nozzle 14 which is connected to the chemical liquid supply pipe 12, supplies the chemical liquid to a substrate, and includes a second non-metallic conductive material, and a grounding conductor 15 which is electrically connected to the conductive layer 13 or the supply nozzle 14 and is grounded to an outside of the pipe 12.

The second non-metallic conductive material of the supply nozzle 14 may be electrically or directly connected to the conductive layer 13 of the chemical liquid supply pipe 12. The supply nozzle 14 may include a porous material layer, a turbulent flow induction block, a bundle having a plurality of small pipes, or a combination thereof.

Also, the apparatus configured to supply a chemical liquid for processing a semiconductor substrate may further include a pump 16, which supplies the chemical liquid for processing a semiconductor, between the storage container 11 and the chemical liquid supply pipe 12.

Also, the apparatus configured to supply a chemical liquid for processing a semiconductor substrate may further include a static electricity measurement sensor 17 which is formed to pass through an outer wall of the chemical liquid supply pipe 12 or the supply nozzle 14 and measures an electric charge of a chemical liquid flowing in the chemical liquid supply pipe 12 or the supply nozzle 14. One end of the static electricity measurement sensor 17 may protrude or may not protrude toward a center of the chemical liquid supply pipe.

As described in more detail below, a surface of the static electricity measurement sensor 17 formed to pass through the outer wall of the chemical liquid supply pipe 12 may be coated with a first layer having a non-conductive material and a second layer having a third non-metallic conductive material, and the static electricity measurement sensor 17 may include an insulating layer between the conductive layer 13 and the second layer so that the second layer is not electrically connected to the conductive layer 13 formed on the inner surface of the chemical liquid supply pipe 12. The insulating layer may include a non-metallic non-conductive material and may include the same material as the chemical liquid supply pipe 12. The first layer may be formed on the surface of the static electricity measurement sensor 17, and the second layer may be formed on the first layer.

The second layer may be electrically connected to the grounding conductor 15 grounded to the outside of the pipe 12. Also, as described in more detail below, a switch may be further provided between the second layer and the grounding conductor 15 grounded to the outside of the pipe 12 to switch between grounding and grounding release. The switch may switch between the grounding and grounding release of the second layer by turning the switch on or off using the monitoring system connected to the static electricity measurement sensor 17.

Also, the chemical liquid supply apparatus according to an example embodiment of the present inventive concept may further include a static electricity measurement sensor 17 which is formed to pass through the outer wall of the supply nozzle 14 and measures static electricity in the supply nozzle 14.

One end of the static electricity measurement sensor 17 may protrude or may not protrude toward a center of the supply nozzle 14.

The static electricity measurement sensor 17 may be, for example, a voltage meter, a surface electrometer, an electric charge meter, a static electricity discharge detector, or the like.

A general static electricity measurement sensor is a non-contact static electricity measurement sensor and may measure a current, a voltage, or an amount of electric charge of a measured object while maintaining a predetermined distance to the measured object. Here, when the static electricity measurement sensor comes into contact with the measured object, an electric charge of the measured object moves to the static electricity measurement sensor or the measured object is grounded by the static electricity measurement sensor, and thus it is difficult to accurately measure the current, the voltage, or the amount of electric charge of the measured object.

The chemical liquid supply apparatus according to an example embodiment of the present inventive concept is for measuring the electric charge of the chemical liquid flowing in the chemical liquid supply pipe 12, and the surface of the static electricity measurement sensor 17 may be coated with the first layer including the non-conductive material to prevent the surface from coming into direct contact with the chemical liquid. The direct contact between the static electricity measurement sensor 17 and the chemical liquid may be prevented by coating the surface with the first layer including the non-conductive material, and the static electricity of the chemical liquid flowing in the chemical liquid supply pipe 12 may be measured by measuring the electric charge of the chemical liquid flowing in the chemical liquid supply pipe 12 while maintaining the predetermined distance to the chemical liquid.

It may be difficult for the static electricity measurement sensor 17 coated with the first layer to accurately measure the electric charge because electrostatic induction occurs due to friction between the non-conductive material of the first layer and the flowing chemical liquid. In order to accurately measure the electric charge of the flowing chemical liquid, the first layer may be further coated with the second layer which is insulated from the conductive layer 13 and made of the third non-metallic conductive material. Therefore, the electric charge generated by the electrostatic induction due to friction between the chemical liquid and the first layer may be reduced or removed by controlling grounding or grounding release of the second layer.

When the second layer is continuously grounded while measuring the electric charge of the chemical liquid, since the static electricity measurement sensor 17 may not properly measure the electric charge of the chemical liquid in the chemical liquid supply pipe 12 or the supply nozzle 14 due to the ground, the second layer is electrically insulated from the conductive layer 13, which is formed on the inner surface of the chemical liquid supply pipe 12, by the insulating layer. While the static electricity measurement sensor 17 measures the electric charge of the chemical liquid in the chemical liquid supply pipe 12 or the supply nozzle 14, the switch is turned off by the monitoring system connected to the static electricity measurement sensor 17 and the ground of the second layer is released. Therefore, the electric charge generated due to friction between the second layer and the chemical liquid may be removed and an accurate electric charge state of the chemical liquid flowing in the chemical liquid supply pipe 12 may be measured.

The non-conductive material of the first layer may be a non-conductive resin selected from the group consisting of polyvinylidenefluoride (PVDF), polyetheretherketone (PEEK), perfluoroalkoxy (PFA), and polytetrafluoroethylene (PTFE).

The third non-metallic conductive material of the second layer may be at least one conductive polymer selected from the group consisting of polyaniline, polypyrrole, polythiophene, poly(ethylenedioxy)thiophene (PEDOT), polyacetylene, polyphenylene, and polyphenylenevinylene, or may be a conductive resin selected from the group consisting of carbon-containing PVDF, carbon-containing PEEK, carbon-containing PFA, and carbon-containing PTFE. The third non-metallic conductive material may be the same as or different from the first non-metallic conductive material or the second non-metallic conductive material described above.

The chemical liquid for processing a semiconductor substrate accommodated in the storage container 11 may pass through the chemical liquid supply pipe 12 and the supply nozzle 14 and may be sprayed onto a substrate 18 located on a substrate support 19. The chemical liquid sprayed onto the substrate 18 may process the substrate 18 by etching, rinsing, or cleaning the substrate 18 according to the supplied chemical liquid while flowing outward from a center of the substrate 18 due to rotation of the substrate support 19.

The grounding conductor 15 may use a corrosion-resistant wire or a metal conductor having sufficient strength to remove the electric charge present in the chemical liquid flowing in the chemical liquid supply pipe 12 and the supply nozzle 14, and the grounding conductor 15 may be grounded to the outside of the chemical liquid supply pipe 12 or the supply nozzle 14.

An electric charge is generated in the chemical liquid while the chemical liquid for processing a semiconductor substrate passes through the chemical liquid supply pipe 12 and the supply nozzle 14. When the chemical liquid is a non-electrolytic liquid (e.g., deionized water or isopropyl alcohol (IPA)), such a phenomenon may become more significant. Hereinafter, generation and removal of the electric charge in the chemical liquid will be described.

Figure 2A:
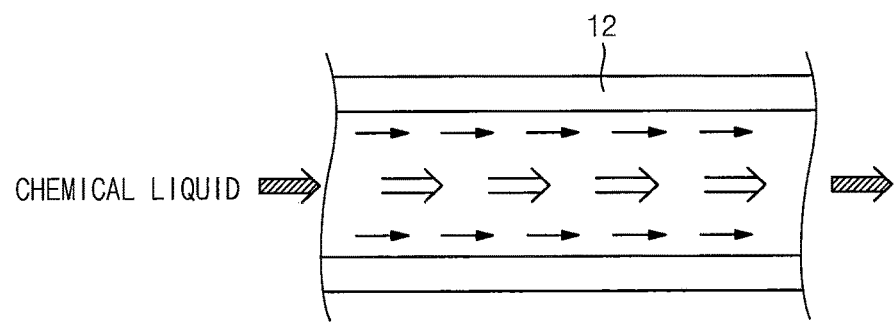
FIGS. 2A to 2C are diagrams that illustrate generating and removing actions of an electric charge in a chemical liquid flowing in a pipe.
Figure 2B:
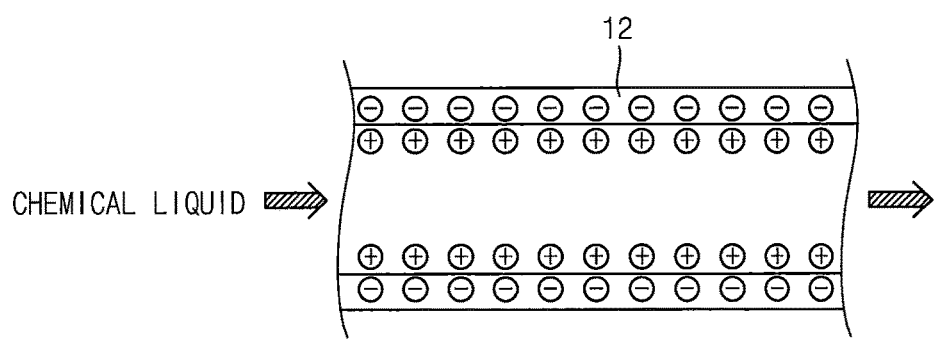

Referring to FIGS. 2A and 2B, during supply of the chemical liquid for processing a semiconductor, electrostatic induction occurs at the chemical liquid and a liquid-contacting portion of the chemical liquid supply pipe 12 due to friction between the chemical liquid and the chemical liquid supply pipe 12 (see FIG. 2B) while the chemical liquid passes through the chemical liquid supply pipe 12 (see FIG. 2A), the chemical liquid is charged with a positive (+)

electric charge, and the liquid-contacting portion is charged with a negative (−) electric charge. Such a phenomenon may be more significant in a metal-free chemical liquid supply apparatus including no metal to suppress metal contamination.

Figure 2C:
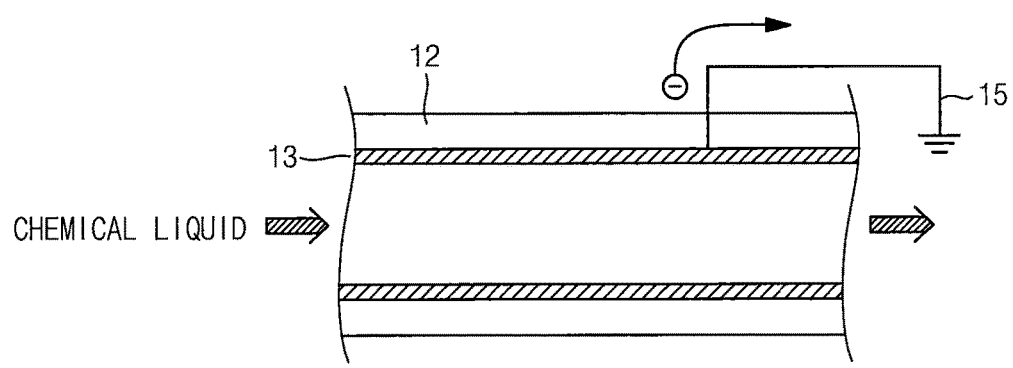
Figure 3A:
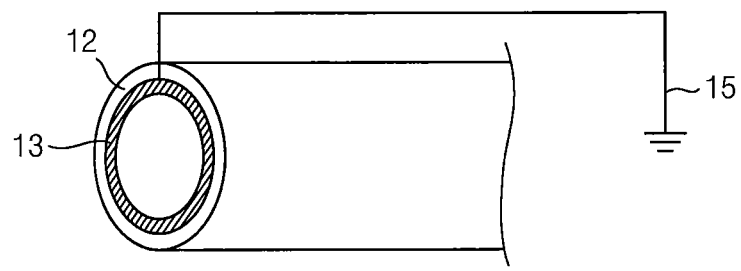
FIGS. 3A to 3F are cross-sectional views illustrating shapes of a chemical liquid supply pipe in which a conductive layer is formed according to an example embodiment of the present inventive concept.
Figure 3B:
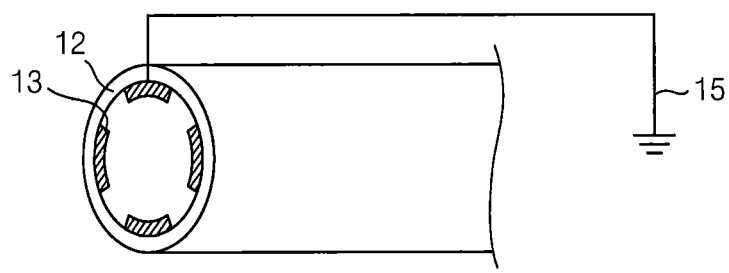
Figure 3C:
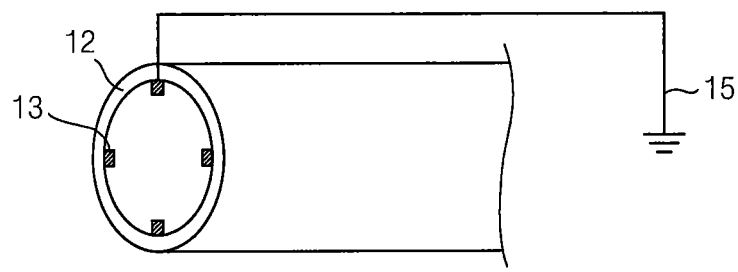
Figure 3D:
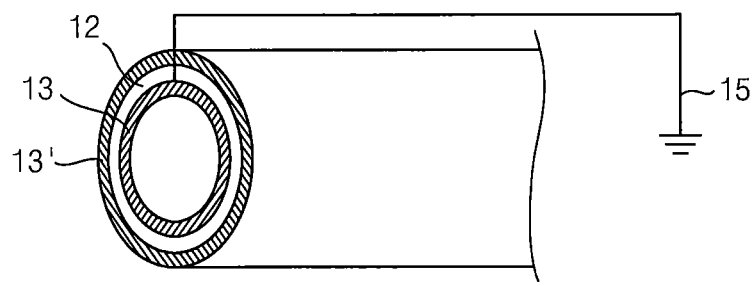
Figure 3E:
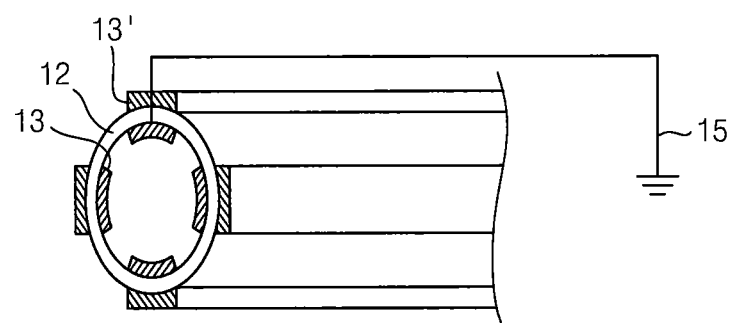
Figure 3F:
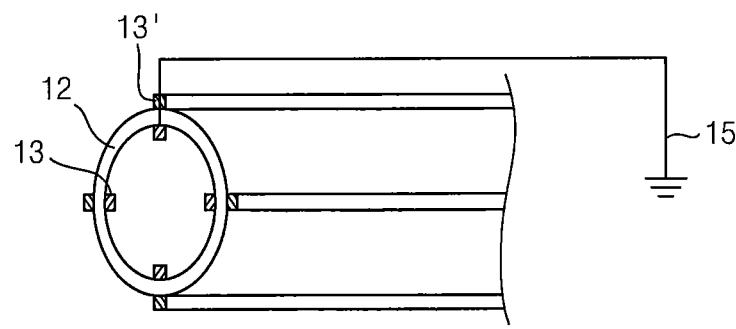

However, the conductive layer 13 may be formed on a part or all of the inner surface of the chemical liquid supply pipe 12 according to the example embodiments of the present inventive concept, may include the first non-metallic conductive material, and may be electrically connected to the grounding conductor 15 grounded to the outside of the pipe 12 (see FIG. 2C). Therefore, the electric charges generated in the chemical liquid and in the liquid-contacting portion of the chemical liquid supply pipe 12 in FIG. 2B may be reduced or removed.

Referring to FIGS. 3A to 3F, the conductive layer 13 including the first non-metallic conductive material may be formed on a part or all of the inner surface of the chemical liquid supply pipe 12. In addition, a conductive layer 13' may be formed on a part or all of an outer surface of the chemical liquid supply pipe 12.

The conductive layers 13 and 13' may coat and cover the inner surface or the outer surface of the chemical liquid supply pipe 12 or may be formed on the inner surface of the chemical liquid supply pipe 12 to have a line shape, a bar shape, a lattice shape, or a combination thereof. The shape of the conductive layer 13 is not particularly limited as long as the conductive layer 13 comes into contact with the chemical liquid in the chemical liquid supply pipe 12 and is electrically connected to the grounding conductor 15 grounded to the outside of the pipe 12.

According to an example embodiment of the present inventive concept, the conductive layers 13 and 13' including the first non-metallic conductive material may be formed on a part or all of the inner surface and the outer surface of the chemical liquid supply pipe 12 and electrically connected to the grounding conductor 15 grounded to the outside of the chemical liquid supply pipe 12. Therefore, electric charges generated in the inside and outside of the chemical liquid supply pipe 12 and the electric charge generated in the chemical liquid passing through the chemical liquid supply pipe 12 may be reduced or removed.

Figure 4:
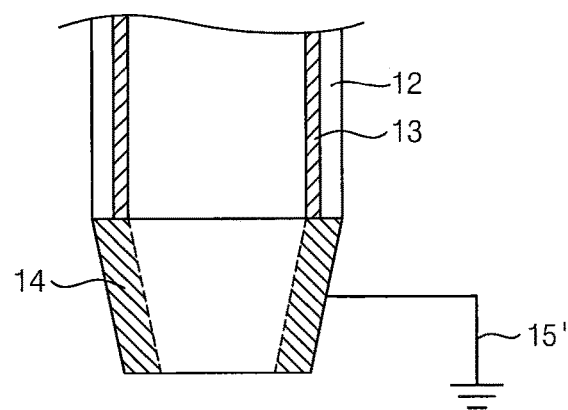
FIG. 4 is a longitudinal sectional view illustrating a nozzle configured to supply a chemical liquid for processing a semiconductor substrate according to an example embodiment of the present inventive concept.

Referring to FIG. 4, the supply nozzle 14 according to an example embodiment of the present inventive concept may include the second non-metallic conductive material, and the second non-metallic conductive material may be the same as or different from the first non-metallic conductive material included in the conductive layer 13 formed on the inner surface of the chemical liquid supply pipe 12. Also, the supply nozzle 14 may be electrically connected to the conductive layer 13 formed on the inner surface of the chemical liquid supply pipe 12. The second non-metallic conductive material of the supply nozzle 14 may come into direct contact with the conductive layer 13 of the chemical liquid supply pipe 12.

The supply nozzle 14 including the second non-metallic conductive material may be electrically connected to the conductive layer 13 formed on the inner surface of the chemical liquid supply pipe 12, and thus an electric charge of the supply nozzle 14 and the electric charge of the chemical liquid in contact with the supply nozzle 14 may be reduced or removed through a grounding conductor 15' which is electrically connected to the supply nozzle 14 and is grounded to the outside of the chemical liquid supply pipe 12.

The supply nozzle 14 is an end portion which comes into contact with the chemical liquid before the chemical liquid from the storage container 11 reaches the substrate through the chemical liquid supply pipe 12, and a state of the electric charge in the chemical liquid while passing through the supply nozzle 14 may greatly affect adsorption of particles onto the substrate.

Even when the electric charge is removed from the chemical liquid supply pipe 12 before the chemical liquid passes through the supply nozzle 14, there is a possibility that an electric charge is generated or increased in the chemical liquid due to friction between the chemical liquid and the supply nozzle 14 while the chemical liquid passes through the supply nozzle 14. When the chemical liquid having the electric charge generated therein as described above reaches the substrate, the electric charge may cause particle adsorption onto the substrate.

In an example embodiment of the present inventive concept, the electric charge in the chemical liquid which reaches the substrate is reduced or removed by reducing or removing the electric charge in the chemical liquid passing through the supply nozzle 14 and the chemical liquid supply pipe 12, and thus adsorption of particles onto the substrate may be suppressed or prevented.

The conductive layer 13, which is formed on the inner surface of the chemical liquid supply pipe 12, and the supply nozzle 14 may include the first non-metallic conductive material and the second non-metallic conductive material, respectively. The first non-metallic conductive material and the second non-metallic conductive material may each independently include at least one conductive polymer selected from the group consisting of polyaniline, polypyrrole, polythiophene, PEDOT, polyacetylene, polyphenylene, and polyphenylenevinylene, or a conductive resin selected from the group consisting of carbon-containing PVDF, carbon-containing PEEK, carbon-containing PFA, and carbon-containing PTFE. Also, the third non-metallic conductive material may be the same as or different from the first non-metallic conductive material or the second non-metallic conductive material.

The conductive material may be a non-metal, and when the conductive material is a metal, a metal portion made of the conductive material in contact with the chemical liquid may be eluted and adversely affect the substrate. Eluted metal impurities have a negative influence on physical and electrical qualities of a semiconductor device, and thus manufacturing reliability and a yield of the semiconductor device may be greatly lowered. That is, the metal impurities diffuse into the substrate when a temperature increases, are located at a deep level within a silicon forbidden area, and act as trap centers that cause generation and recombination of minority carriers. Therefore, a lifetime of the minority carriers may be reduced, a p-n junction leakage current may be increased, and an oxide insulation breakdown voltage may be reduced. Also, the metal impurities may cause stacking defects or the like after an oxidation or epitaxy process, may cause structural defects even at a gate oxide film and/or a silicon interface, and may degrade qualities of the device such as an increase of density around the interface and the like. In this way, the influence of the metal impurities becomes significant along with miniaturization of the device, and it is necessary to limit the metal impurities on a surface of the silicon substrate in a deep submicron device. In order to prevent contamination of the substrate due to the metal impurities, the conductive material may be a non-metal.

Since the conductive layer 13, which is formed on the inner surface of the chemical liquid supply pipe 12, and the supply nozzle 14 are made of a conductive material excluding a metal, metal contamination of the substrate may be prevented by suppressing incorporation of a metal due to elution of metal impurities into the chemical liquid.

The carbon contained in the conductive resin may be a hard carbon material having a uniform and dense structure and is excellent in conductivity, chemical resistance, heat resistance, or the like. The carbon may be, for example, a carbon powder, a carbon nanotube, graphene, or graphite.

A content of carbon contained in the conductive resin may be 25 mass % or more and 35 mass % or less with respect to a total mass of the conductive resin. Alternatively, the content of carbon may be 28 mass % or more and 32 mass % or less. Alternatively, the content of carbon may be 30 mass % or more.

When the content of carbon contained in the conductive resin is within the above ranges, the electric charge generated in the chemical liquid may be efficiently reduced or removed, and the carbon-containing conductive resin exhibits excellent chemical resistance, heat resistance, and the like with respect to the chemical liquid.

The chemical liquid flowing in the chemical liquid supply apparatus may be a rinsing liquid used in a rinsing process among semiconductor substrate processing processes or a cleaning liquid used in a cleaning process. The chemical liquid may be, for example, deionized water or a rinsing liquid or cleaning liquid containing an organic solvent, and the organic solvent may be one selected from the group consisting of methanol, ethanol, 2-propanol, n-butanol, isopropyl alcohol, ethyl glycol, propyl glycol, butyl glycol, ethyl diglycol, butyl diglycol, n-pentane, acetone, ethyl acetate, methyl ethyl ketone, n-heptane, toluene, methyl isobutyl ketone, isobutyl acetate, n-butyl acetate, sec-butyl alcohol, 2-ethoxyethanol, methyl n-amyl ketone, 2-ethoxyethyl acetate, n-decane, 2-butoxyethanol, and isoprene.

The conductive layer 13 including the first non-metallic conductive material may come into direct contact with the chemical liquid flowing in the chemical liquid supply pipe 12 and may be electrically connected to the grounding conductor 15 grounded to the outside of the pipe 12. Since the conductive layer 13, which is formed on the inner surface of the chemical liquid supply pipe 12, and the supply nozzle 14 are electrically connected to the grounding conductor 15 grounded to the outside of the pipe 12, electric charges generated in the chemical liquid and in a liquid-contacting surface of the chemical liquid supply pipe 12 due to friction between the chemical liquid and the surface of the chemical liquid supply pipe 12 may be reduced or removed.

Hereinafter, the present inventive concept will be described in detail with examples. However, a range of the technological scope of the present inventive concept is not limited to the following specific examples.

[Measurement of Electric Charge of Substrate]

In the following Examples 1-1 and 1-2 and Comparative Example 1-1, electric charges of a supply nozzle, a chemical liquid during discharge, a surface of a substrate after discharging the chemical liquid, and the surface of the substrate after drying were measured by changing whether the supply nozzle includes a non-metallic conductive material.

Example 1-1

After IPA passed from a storage container 11 through a chemical liquid supply pipe 12, which is made of PFA excluding carbon and has no conductive layer on an inner surface thereof, and a supply nozzle 14 made of carbon-PEEK, electric charges of the supply nozzle, the IPA immediately before reaching an inlet of the nozzle and a substrate during discharge, a surface of the substrate immediately after discharging the IPA, and the surface of the substrate after drying were measured. Results thereof are illustrated in Table 1 below.

Example 1-2

After IPA passed from a storage container 11 through a chemical liquid supply pipe 12, which is made of PFA excluding carbon and has no conductive layer on an inner surface thereof, and a supply nozzle 14 made of CR6110, electric charges of the supply nozzle, the IPA immediately before reaching an inlet of the nozzle and a substrate during discharge, a surface of the substrate immediately after discharging the IPA, and the surface of the substrate after drying were measured. Results thereof are illustrated in Table 1 below.

Comparative Example 1-1

After IPA passed from a storage container 11 through a chemical liquid supply pipe 12, which is made of PFA excluding carbon and has no conductive layer on an inner surface thereof, and a supply nozzle 14 made of PFA excluding carbon, electric charges of the supply nozzle, the IPA immediately before reaching an inlet of the nozzle and a substrate during discharge, a surface of the substrate immediately after discharging the IPA, and the surface of the substrate after drying were measured. Results thereof are illustrated in Table 1 below.

TABLE 1

|  | Supply Nozzle | IPA During Discharge | | Surface of Substrate After Discharging IPA | Surface of Substrate After Drying |
| --- | --- | --- | --- | --- | --- |
| Example 1-1 | −125 V | −140 V | −50 V | −2 V | −3 V |
| Example 1-2 | −670 V | −170 V | −50 V | −1 V | −3 V |
| Comparative Example 1-1 | — | −720 V | −130 V | −4 V | −5 V |

From the results illustrated in Table 1, it was found that the electric charge on the surface of the substrate after drying can be significantly reduced in a chemical liquid supply apparatus using the supply nozzle 14 including the carbon-containing conductive resin (e.g., carbon-PEEK, CR6110, etc.) according to an example embodiment of the present inventive concept in comparison to a chemical liquid supply apparatus using the supply nozzle 14 including the non-conductive resin (e.g., PFA) excluding carbon.

In the following Example 2-1 and Comparative Examples 2-1 and 2-2, electric charges of a supply nozzle, a chemical liquid during discharge, a surface of a substrate after discharging the chemical liquid, and the surface of the substrate after drying were measured by changing whether a conductive layer including a non-metallic conductive material is formed on an inner surface of a chemical liquid supply pipe and whether the supply nozzle includes a non-metallic conductive material.

Example 2-1

After IPA passed from a storage container 11 through a chemical liquid supply pipe 12 in which a conductive layer 13 including carbon-PEEK was formed on an inner surface of the chemical liquid supply pipe 12 and a supply nozzle 14 made of carbon-PEEK, electric charges of the supply nozzle, the IPA immediately before reaching an inlet of the nozzle and a substrate during discharge, a surface of the substrate immediately after discharging the IPA, and the surface of the substrate after drying were measured. Results thereof are illustrated in Table 2 below.

Comparative Example 2-1

After IPA passed from a storage container 11 through a chemical liquid supply pipe 12 in which a conductive layer 13 including carbon-PEEK was formed on an inner surface of the chemical liquid supply pipe 12 and a supply nozzle 14 made of PFA excluding carbon, electric charges of the supply nozzle, the IPA immediately before reaching an inlet of the nozzle and a substrate during discharge, a surface of the substrate immediately after discharging the IPA, and the surface of the substrate after drying were measured. Results thereof are illustrated in Table 2 below.

Comparative Example 2-2

After IPA passed from a storage container 11 through a chemical liquid supply pipe 12, which is made of PFA excluding carbon and in which a conductive layer was not formed on an inner surface of the chemical liquid supply pipe 12, and a supply nozzle 14 made of carbon-PEEK, electric charges of the supply nozzle, the IPA immediately before reaching an inlet of the nozzle and a substrate during discharge, a surface of the substrate immediately after discharging the IPA, and the surface of the substrate after drying were measured. Results thereof are illustrated in Table 2 below.

TABLE 2

|  | Supply Nozzle | IPA During Discharge | Surface of Substrate After Discharging IPA | Surface of Substrate After Drying |
|---|---|---|---|---|
| Example 2-1 | — | −150 V | −25 V | −1 V | 0 V |
| Comparative Example 2-1 | −140 V | −140 V | −25 V | −3 V | −3 V |
| Comparative Example 2-2 | −125 V | −140 V | −50 V | −2 V | −3 V |

From the results illustrated in Table 2, it was found that the electric charge on the surface of the substrate after drying can be significantly reduced in a chemical liquid supply apparatus using both the chemical liquid supply pipe 12, in which the conductive layer 13 including the carbon-containing conductive resin (e.g., carbon-PEEK or the like) was formed on the inner surface of the chemical liquid supply pipe, and the supply nozzle 14 including the carbon-containing conductive resin (e.g., carbon-PEEK or the like) according to an example embodiment of the present inventive concept in comparison to a chemical liquid supply apparatus using any one of the chemical liquid supply pipe 12, in which the conductive layer 13 including the carbon-containing conductive resin (e.g., carbon-PEEK or the like) was formed on the inner surface of the chemical liquid supply pipe 12, and the supply nozzle 14 including the carbon-containing conductive resin (e.g., carbon-PEEK or the like).

[Amount of Particles Generated on Surface of Substrate]

In the following Example 3-1 and Comparative Example 3-1, an amount of particles generated on a surface of a substrate after supplying IPA thereto was measured by using a chemical liquid supply pipe 12, in which a conductive layer 13 including a first non-metallic conductive material was formed on an inner surface of the chemical liquid supply pipe 12, and a supply nozzle 14 with or without a second non-metallic conductive material.

Example 3-1

After IPA passed from a storage container 11 through a chemical liquid supply pipe 12, in which a conductive layer 13 including carbon-PEEK was formed on an inner surface of the chemical liquid supply pipe 12, and a supply nozzle 14 made of carbon-PEEK, an amount of particles having a size of 19 nm or less generated on a surface of a substrate was measured. Results thereof are illustrated in a graph in FIG. 5.

Comparative Example 3-1

After IPA passed from a storage container 11 through a chemical liquid supply pipe 12, in which a conductive layer 13 including carbon-PEEK was formed on an inner surface of the chemical liquid supply pipe 12, and a supply nozzle 14 made of PFA containing no carbon, an amount of particles having a size of 19 nm or less generated on a surface of a substrate was measured. Results thereof are illustrated in a graph in FIG. 5.

Figure 5:
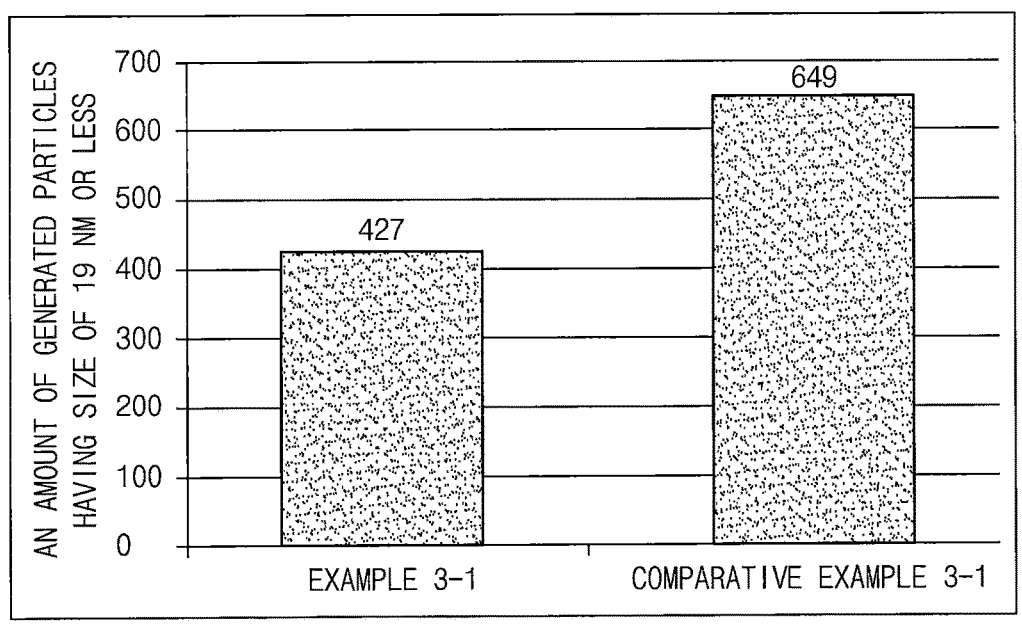
FIG. 5 is a graph illustrating an amount of generated particles having a size of 19 nm or less on a surface of a semiconductor substrate according to an example embodiment of the present inventive concept.

From the results illustrated in the graph in FIG. 5, it was found that the amount of particles having a size of 19 nm or less generated on the surface of the substrate may be reduced by 30% or more in a chemical liquid supply apparatus using both the chemical liquid supply pipe 12, in which the conductive layer 13 including the carbon-containing conductive resin (e.g., carbon-PEEK or the like) was formed on the inner surface of the chemical liquid supply pipe 12, and the supply nozzle 14 including the carbon-containing conductive resin (e.g., carbon-PEEK or the like) according to an example embodiment of the present inventive concept in comparison to a chemical liquid supply apparatus using the chemical liquid supply pipe 12, in which the conductive layer 13 including the carbon-containing conductive resin (e.g., carbon-PEEK) was formed on the inner surface of the chemical liquid supply pipe, and the supply nozzle 14 including the non-conductive resin (e.g., PFA) containing no carbon.

Therefore, in the chemical liquid supply apparatus including both the chemical liquid supply pipe 12, in which the conductive layer 13 including the first non-metallic conductive material is formed on the inner surface of the chemical liquid supply pipe 12, and the supply nozzle 14 including the second non-metallic conductive material according to an example embodiment of the present inventive concept, the electric charge on the surface of the substrate after the semiconductor substrate processing process is significantly reduced, and thus the generation of particles on the surface of the semiconductor substrate after drying are significantly reduced.

Meanwhile, in the case of performing a rinsing or cleaning process using the chemical liquid supply apparatus according to an example embodiment of the present inventive concept, as described above, a semiconductor device can be obtained in which pattern defects in a photolithography process due to particle adsorption onto a surface of a substrate thereof, defects such as pinholes and microvoids in a thin film formation process, defective device qualities which interfere with an operation of the device on a device interconnection, and the like are significantly reduced.

Figure 6:
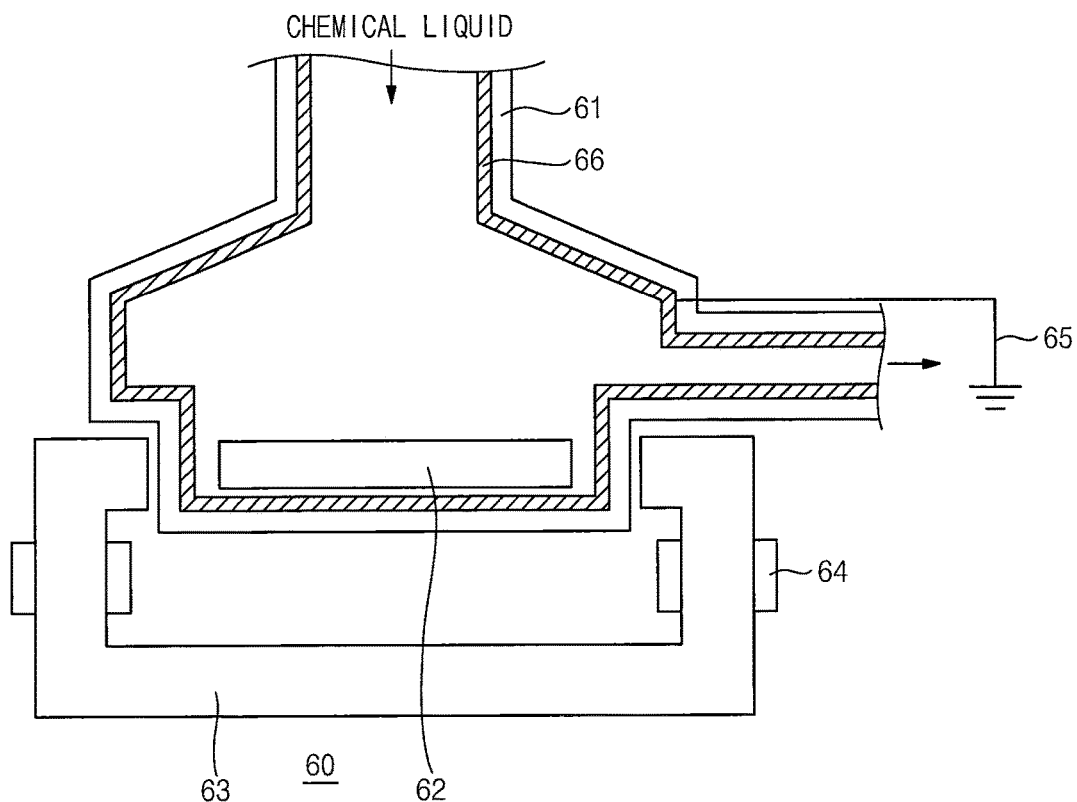
FIG. 6 is a longitudinal sectional view illustrating a pump configured to supply a chemical liquid for processing a semiconductor substrate according to an example embodiment of the present inventive concept.

Referring to FIG. 6, the chemical liquid supply apparatus according to an example embodiment of the present inventive concept may further include a pump 60, which may be located between the storage container 11 and the chemical liquid supply pipe 12 (FIG. 1), having a conductive layer 66 formed on an inner surface of the pump, for supplying a chemical liquid for processing a semiconductor. The pump 60 may include a pump casing 61, a rotor magnet 62, a motor stator 63, and a motor coil 64, although the pump 60 is not limited in the above structure as long as the pump 60 transports the chemical liquid from the storage container 11 to the chemical liquid supply pipe 12.

Also, the conductive layer 66 including a non-metallic conductive material may be formed on a part or all of an inner surface of the pump casing 61, and the conductive layer 66 may come into contact with the chemical liquid inside the pump casing 61 and may be electrically connected to a grounding conductor 65 grounded to an outside of the pump 60.

The non-metallic conductive material may be the same as or different from the first non-metallic conductive material to the third non-metallic conductive material described above.

Figure 7:
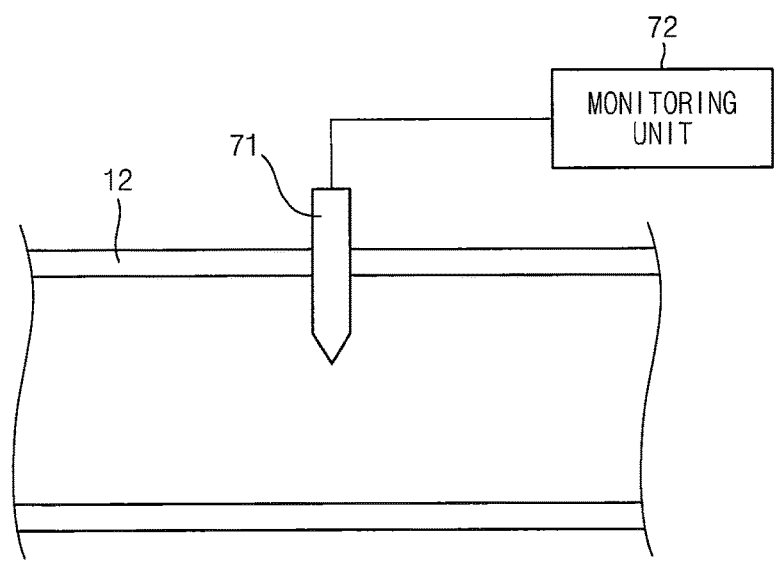
FIG. 7 is a schematic diagram illustrating a static electricity monitoring system according to an example embodiment of the present inventive concept.

FIG. 7 is a schematic diagram illustrating a static electricity monitoring system according to an example embodiment of the present inventive concept.

Referring to FIG. 7, the static electricity monitoring system includes a static electricity measurement sensor 71, which passes through a chemical liquid supply pipe 12 for supplying a chemical liquid, and a monitoring unit 72 connected to the static electricity measurement sensor 71, and thus an electric charge of a flowing chemical liquid may be measured in real time.

Figure 8A:
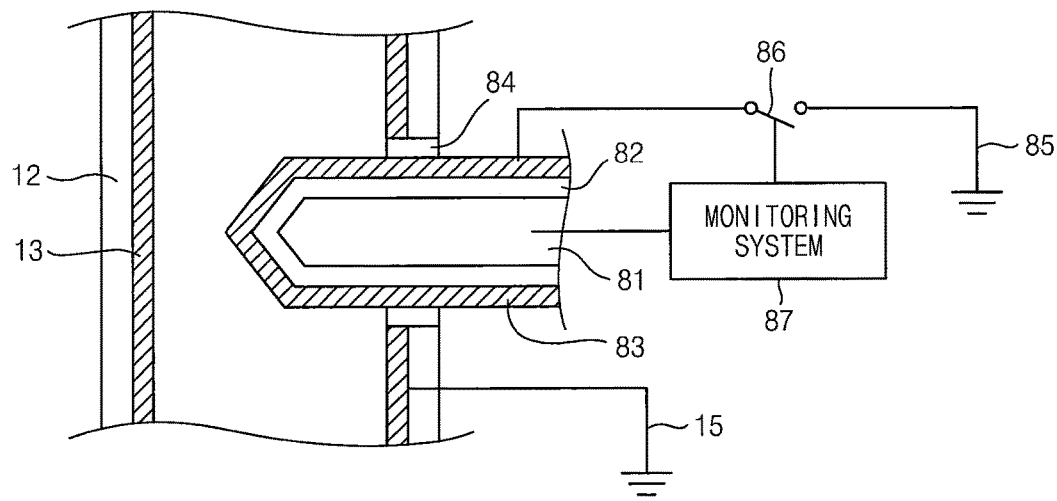
FIGS. 8A and 8B are longitudinal sectional views illustrating static electricity monitoring systems in which a static electricity measurement sensor is applied to a chemical liquid supply pipe according to an example embodiment of the present inventive concept.
Figure 8B:
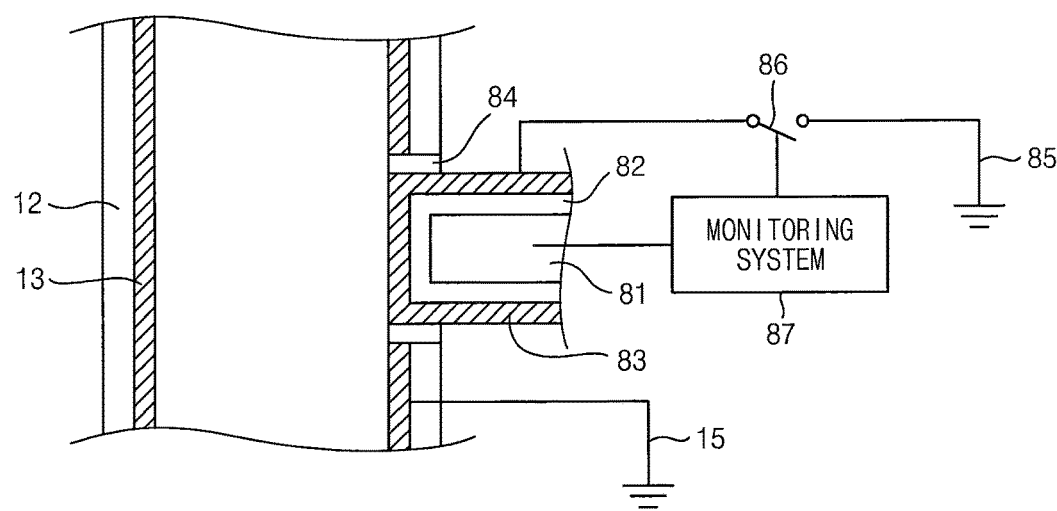

FIGS. 8A and 8B are schematic views illustrating a static electricity monitoring system according to an example embodiment of the present inventive concept.

Referring to FIGS. 8A and 8B, the static electricity monitoring system may include a pipe 12 configured to supply a chemical liquid for processing a semiconductor substrate and a first static electricity measurement sensor 81 which is formed to pass through an outer wall of the chemical liquid supply pipe 12 and measures static electricity in the chemical liquid supply pipe 12.

A surface of the first static electricity measurement sensor 81 formed to pass through the outer wall of the chemical liquid supply pipe 12 may be coated with a first layer 82 having a first non-conductive material and a second layer 83 having a first non-metallic conductive material, and the first static electricity measurement sensor 81 may include an insulating layer 84 between a conductive layer 13 and the second layer 83 so that the second layer 83 is electrically insulated from the conductive layer 13 formed on an inner surface of the chemical liquid supply pipe 12. The insulating layer 84 may include a non-metallic non-conductive material and may include the same material as the chemical liquid supply pipe 12. The first layer 82 may be formed on a surface of the first static electricity measurement sensor 81, and the second layer 83 may be formed on the first layer 82.

The static electricity measurement sensor 81 may be a non-contact static electricity measurement sensor, and may be, for example, a voltage meter, a surface electrometer, an electric charge meter, a static electricity discharge detector, or the like. Alternatively, the static electricity measurement sensor 81 may be an electrostatic voltmeter or a charged plate monitor (CPM).

A general static electricity measurement sensor is a non-contact static electricity measurement sensor and may measure a current, a voltage, or an amount of electric charge of a measured object while maintaining a predetermined distance to the measured object. Here, when the static electricity measurement sensor comes into contact with the measured object, an electric charge of the measured object moves to the static electricity measurement sensor or the measured object is grounded by the static electricity measurement sensor, and thus it is difficult to accurately measure the current, the voltage, or the amount of electric charge of the measured object.

The static electricity monitoring system according to an example embodiment of the present inventive concept is for measuring the electric charge of the chemical liquid flowing in the chemical liquid supply pipe 12, and an outer surface of the first static electricity measurement sensor 81 may be coated with the first layer 82 having the first non-conductive material in order to prevent the outer surface from coming into direct contact with the chemical liquid. The direct contact between the first static electricity measurement sensor 81 and the chemical liquid may be prevented by coating the first static electricity measurement sensor with the first layer 82 having the first non-conductive material, and the static electricity of the chemical liquid flowing in the chemical liquid supply pipe 12 may be measured by measuring the electric charge of the chemical liquid flowing in the chemical liquid supply pipe 12 while maintaining the predetermined distance to the chemical liquid.

It may be difficult for the first static electricity measurement sensor 81 coated with the first layer 82 to accurately measure the electric charge because electrostatic induction occurs due to friction between the first non-conductive material of the first layer 82 and the flowing chemical liquid. In order to accurately measure the electric charge of the flowing chemical liquid, the first layer 82 may be further coated with the second layer 83 which is insulated from the conductive layer 13 and made of the first non-metallic conductive material.

The second layer 83 may be electrically grounded to a grounding conductor 85 grounded to the outside of the pipe 12. Also, a switch 86 may be further provided between the second layer 83 and the grounding conductor 85 grounded to the outside of the pipe 12 to switch between grounding and grounding release. The switch 86 may switch between grounding and grounding release of the second layer 83 by turning the switch 86 on or off using a static electricity monitoring system 87 connected to the static electricity measurement sensor 81.

When the second layer 83 is continuously grounded while measuring the electric charge of the chemical liquid, since the static electricity measurement sensor 81 may not properly measure the electric charge of the chemical liquid due to the ground, the second layer 83 may be electrically insulated from the conductive layer 13 formed on the inner surface of the chemical liquid supply pipe 12 by the insulating layer. While the static electricity measurement sensor 81 measures the electric charge of the chemical liquid in the chemical liquid supply pipe 12 or the supply nozzle 14, the switch 86 may be turned off by the monitoring system 87 connected to the static electricity measurement sensor 81 and the ground of the second layer 83 may be released. Therefore, the electric charge generated due to friction between the second layer 83 and the chemical liquid may be removed and an accurate electric charge state of the chemical liquid flowing in the chemical liquid supply pipe 12 may be measured.

Figure 9A:
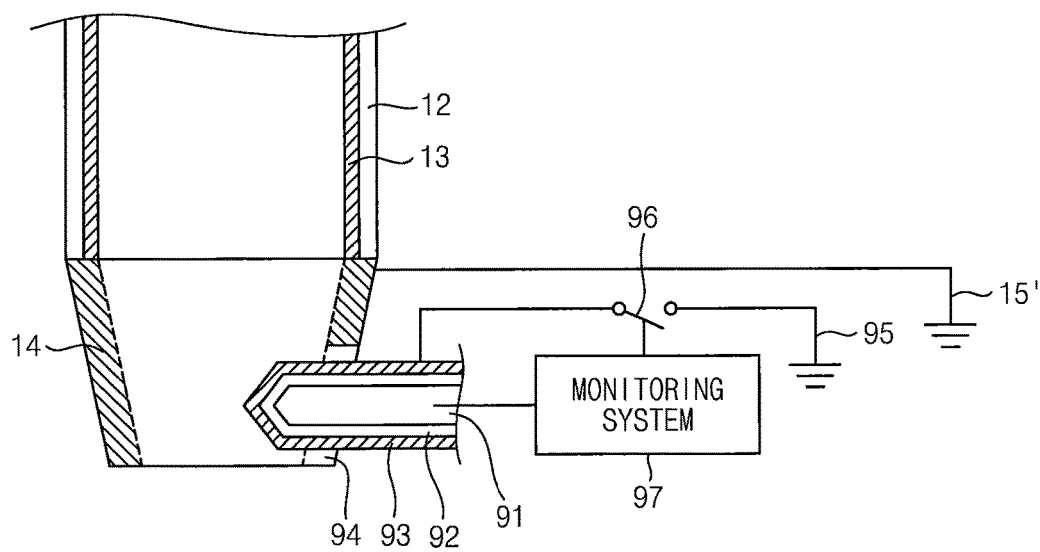
FIGS. 9A and 9B are longitudinal sectional views illustrating static electricity monitoring systems in which a static electricity measurement sensor is applied to a chemical liquid supply nozzle according to an example embodiment of the present inventive concept.
Figure 9B:
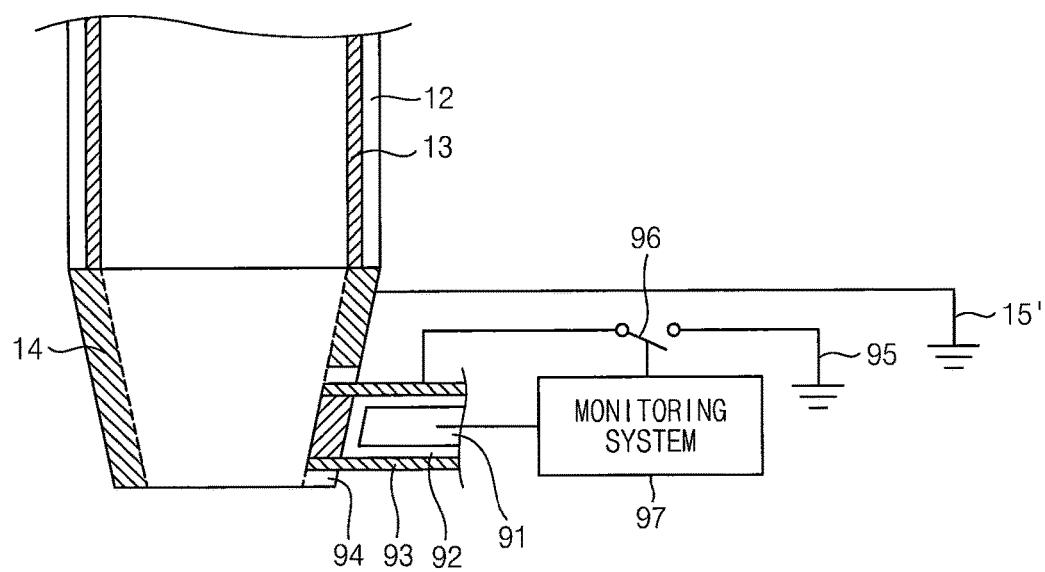

Also, as shown in FIGS. 9A and 9B, the chemical liquid supply apparatus according to an example embodiment of the present inventive concept may further include a static electricity measurement sensor 91 which is formed to pass through an outer wall of the supply nozzle 14 and measures static electricity in the supply nozzle 14.

One end of the static electricity measurement sensor may protrude (e.g., FIGS. 8A and 9A) or may not protrude (e.g., FIGS. 8B and 9B) toward the center of the chemical liquid supply pipe 12 or the supply nozzle 14.

The first non-conductive material of the first layer 82 may be a non-conductive resin selected from the group consisting of PVDF, PEEK, PFA, and PTFE.

The first non-metallic conductive material of the second layer 83 may be at least one conductive polymer selected from the group consisting of polyaniline, polypyrrole, polythiophene, PEDOT, polyacetylene, polyphenylene, and polyphenylenevinylene, or may be a conductive Teflon resin selected from the group consisting of carbon-containing PVDF, carbon-containing PEEK, carbon-containing PFA, and carbon-containing PTFE. The first non-metallic conductive material may be the same as or different from the first non-metallic conductive material of the conductive layer 13 or the second non-metallic conductive material of the supply nozzle 14 described above.

In an example embodiment of the present inventive concept, the electric charge present in the supplied chemical liquid may be measured and managed due to the static electricity monitoring system including the first static electricity measurement sensor 81 formed to pass through the chemical liquid supply pipe 12. Production of semiconductor wafers in which particles are generated by an electric charge accumulated in a supplied chemical liquid can be reduced by identifying a problem such as grounding failure or the like in real time and rapidly responding through a static electricity removing method such as an additional ground, and thus economic loss can be reduced.

Also, in an example embodiment of the present inventive concept, a static electricity sensing method using the static electricity measurement sensor 81 of the static electricity monitoring system 87 may include releasing the ground of the second layer 83 and measuring the electric charge of the chemical liquid flowing in the pipe 12 by using the static electricity measurement sensor 81 in a state in which the ground of the second layer 83 is released during the measurement of the electric charges of the chemical liquid by turning the switch 86 off immediately before the electric charge of the chemical liquid is measured. An accurate electric charge state of the chemical liquid flowing in the chemical liquid supply pipe 12 can be measured and managed in real time by removing the electric charge generated due to friction with the chemical liquid.

Referring to FIGS. 9A and 9B, a static electricity monitoring system according to an example embodiment of the present inventive concept may include a supply nozzle 14 which is connected to a chemical liquid supply pipe 12, that supplies a chemical liquid for processing a semiconductor substrate to a substrate, and includes a third non-metallic conductive material, a second static electricity measurement sensor 91 which is formed to pass through an outer wall of the supply nozzle 14 and in which a third layer 92 having a second non-conductive material and a fourth layer 93 having a fourth non-metallic conductive material are formed on a surface of the static electricity measurement sensor 91, and a grounding conductor 95 which is electrically connected to the fourth layer 93 and is grounded to an outside of the pipe 12. The third layer 92 may be formed on a surface of the second static electricity measurement sensor 91, and the fourth layer 93 may be formed on the third layer 92.

A surface of the second static electricity measurement sensor 91 formed to pass through the outer wall of the chemical liquid supply pipe 12 may be coated with the third layer 92 having the second non-conductive material and the fourth layer 93 having the fourth non-metallic conductive material, and the second static electricity measurement sensor 91 may further include an insulating layer 94 between a conductive layer 13 and the fourth layer 93 so that the fourth layer 93 is electrically insulated from the conductive layer 13 formed on an inner surface of the chemical liquid supply pipe 12. The third layer 92 may be formed on the surface of the second static electricity measurement sensor 91, and the fourth layer 93 may be formed on the third layer 92. The second static electricity measurement sensor 91 may be the same as or different from the first static electricity measurement sensor 81. Also, in the static electricity monitoring system of FIGS. 9A and 9B, a configuration of the static electricity measurement sensor and a static electricity measuring method may be the same as those in the static electricity monitoring system of FIGS. 8A and 8B except for a measurement of an electric charge of in the supply nozzle. For example, a switch 96 and a static electricity monitoring system 97 may be used in the same or similar way as described above in reference to the switch 86 and the static electricity monitoring system 87.

Figure 10:
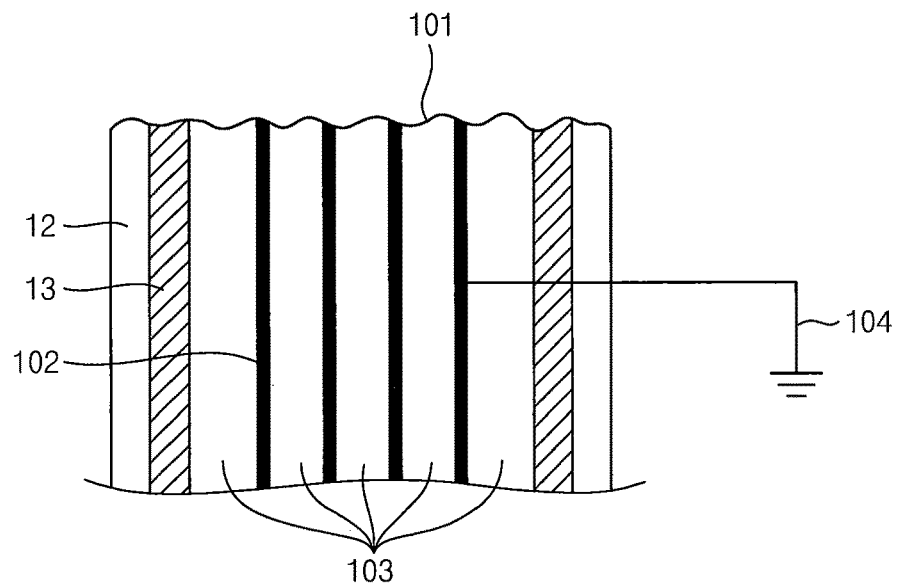
FIG. 10 is a longitudinal sectional view illustrating a chemical liquid supply pipe to which a partition structure is applied according to an example embodiment of the present inventive concept.
Figure 11:
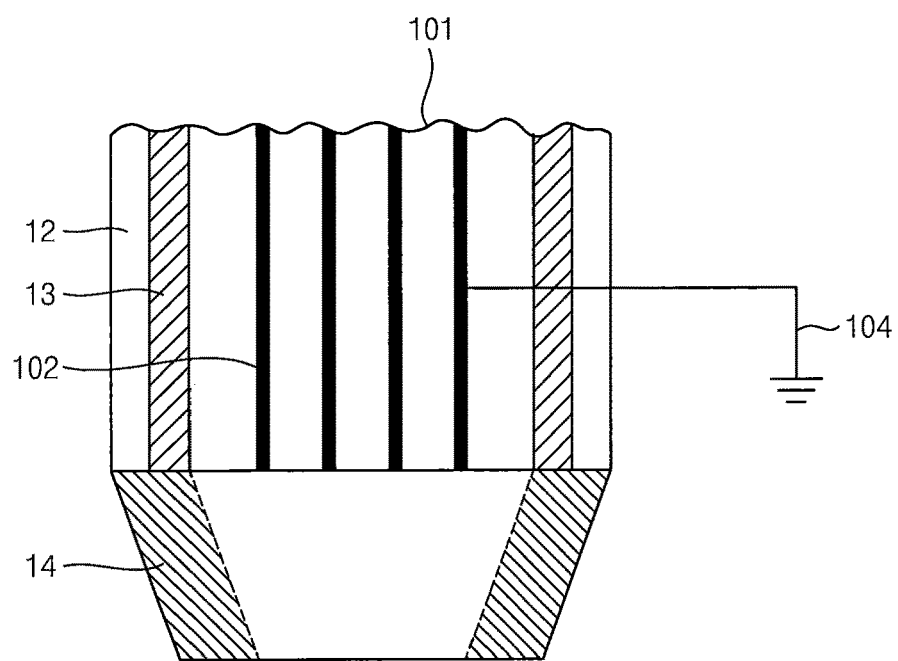
FIG. 11 is a longitudinal sectional view illustrating a chemical liquid supply pipe having a partition structure and an end of the chemical liquid supply pipe to which a supply nozzle is applied according to an example embodiment of the present inventive concept.

FIGS. 10 and 11 are longitudinal sectional views illustrating a chemical liquid supply pipe according to an example embodiment of the present inventive concept.

Referring to FIG. 10, the chemical liquid supply pipe may include a pipe 12 having an inlet or inlets 101 for a chemical liquid for processing a semiconductor substrate, a conductive layer 13 which includes a first non-metallic conductive material and is formed on an inner surface of the pipe 12, a partition structure 102 which includes a second non-metallic conductive material and is formed to divide an inside of the pipe 12 into a plurality of flow paths, a plurality of chemical liquid flow portions 103 which are made of or correspond to the plurality of flow paths divided by the partition structure and into which the chemical liquid for processing a semiconductor substrate is introduced, and a grounding conductor 104 which is electrically connected to the partition structure 102 and is grounded to an outside of the pipe 12.

In the chemical liquid supply pipe 12, when a large amount of chemical liquid is supplied, a diameter of the chemical liquid supply pipe increases. As the diameter of the chemical liquid supply pipe increases, a distance between a central portion of the chemical liquid supply pipe and an interface at which the conductive layer formed on the inner surface of the chemical liquid supply pipe comes into contact with the chemical liquid increases.

As the distance between the central portion of the chemical liquid supply pipe and the interface at which the conductive layer comes into contact with the chemical liquid increases, removal efficiency of an electric charge of the chemical liquid passing through the central portion of the chemical liquid supply pipe by the conductive layer formed on the inner surface of the chemical liquid supply pipe can be reduced.

In order to improve the removal efficiency of an electric charge of the central portion of the chemical liquid supply pipe, in an example embodiment of the present inventive concept, since the partition structure 102, which includes the second non-metallic conductive material and is formed to divide the inside of the chemical liquid supply pipe 12 into the plurality of flow paths, is formed inside the chemical liquid supply pipe 12, a contact area between the chemical liquid and the second non-metallic conductive material may be increased, a distance between the central portion of the chemical liquid supply pipe and the partition structure 102 including the second non-metallic conductive material may be reduced, and thus the electric charge at the center portion of the chemical liquid supply pipe 12 can also be reduced or removed.

The partition structure 102 may have a structure that does not interfere with a flow of the chemical liquid, and the partition structure 102 may be electrically connected to the conductive layer 13 formed on the inner surface of the chemical liquid supply pipe 12.

In order not to interfere with the flow of the chemical liquid, the plurality of flow paths are formed with the partition structure 102 including the second non-metallic conductive material, and thus the plurality of flow paths do not interfere with the flow of the chemical liquid while the electric charge generated in the chemical liquid can be further efficiently reduced or removed.

Referring to FIG. 11, the chemical liquid supply pipe 12 may further include a supply nozzle 14 including a third non-metallic conductive material. The third non-metallic conductive material may be the same as or different from the first non-metallic conductive material and the second non-metallic conductive material.

Figure 12A:
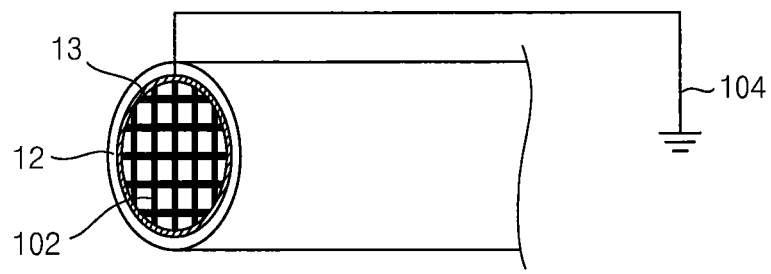
FIGS. 12A to 12C are cross-sectional views illustrating chemical liquid supply pipes to which a partition structure is applied according to an example embodiment of the present inventive concept.
Figure 12B:
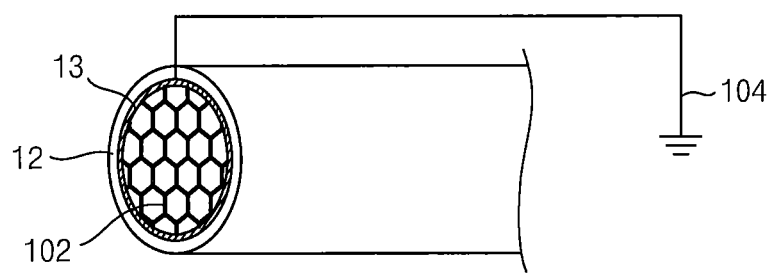
Figure 12C:
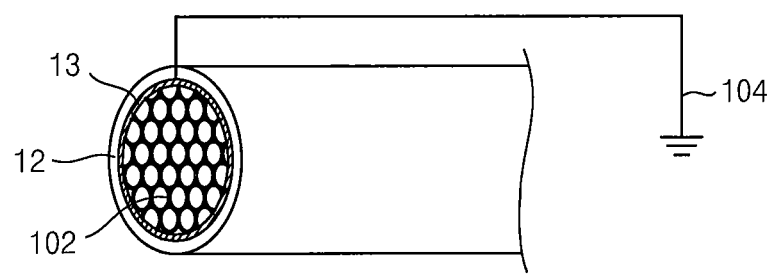

Referring to FIGS. 12A to 12C, a structure of the partition structure 102 may be formed to divide the inside of the chemical liquid supply pipe 12 into the plurality of flow paths, and a cross-sectional shape of the partition structure 102 in the chemical liquid supply pipe 12 may be a honeycomb shape.

When the cross-sectional shape is the honeycomb shape, a shape of each of the flow paths may be a lattice shape (or rectangular or square shape), a hexagonal shape, or a tubular shape, which is formed by the flow paths being electrically connected, and the honeycomb shape is not limited thereto and may include any shape as long as the shape does not interfere with the flow of the chemical liquid.

Figure 13A:
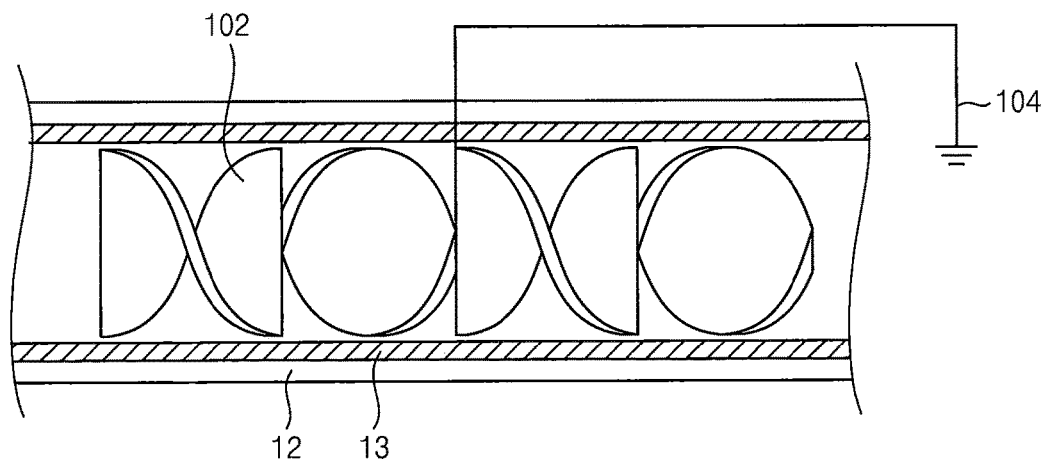
FIGS. 13A and 13B are a cross-sectional view and a perspective view illustrating a chemical liquid supply pipe to which a static mixer-shaped partition structure is applied according to an example embodiment of the present inventive concept.
Figure 13B:
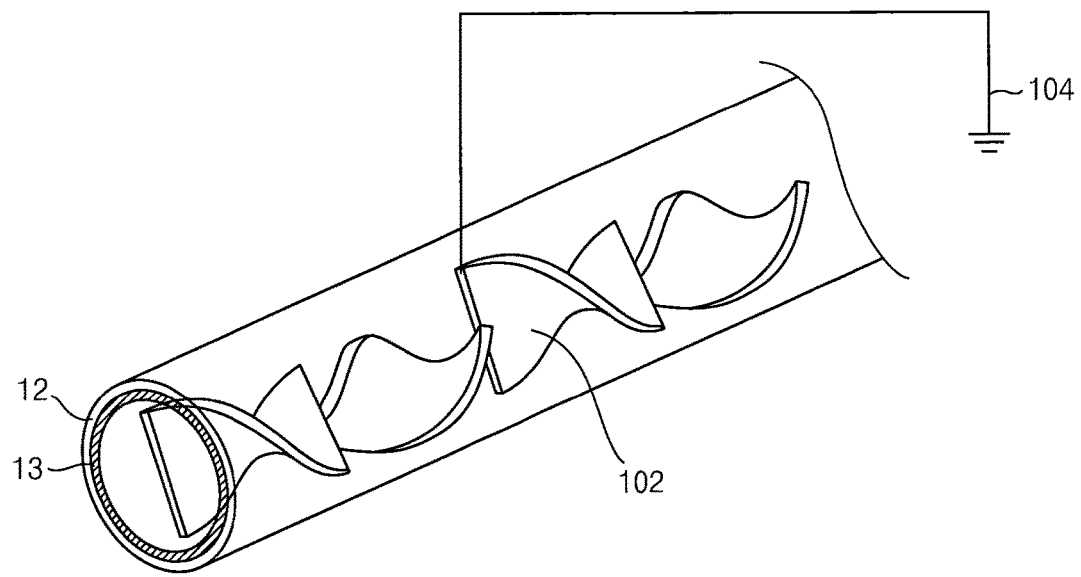

Referring to FIGS. 13A and 13B, the partition structure 102 may have a static mixer shape (e.g., a helical or spiral shape with the partition structure optionally including a plurality of helical or spiral segments). The static mixer shape may reduce the electric charge generated due to friction with the chemical liquid supply pipe 12 due to a constant laminar flow of the chemical liquid by mixing the chemical liquid flowing at a portion of the chemical liquid supply pipe 12 in contact with the chemical liquid flowing at a central portion thereof and forming a turbulent flow, and may reduce the overall electric charge of the chemical liquid flowing in the chemical liquid supply pipe 12 by mixing the chemical liquid in a portion in contact with an inner surface of a high charged supply pipe 12 with the chemical liquid in the central portion of a low charged supply pipe 12.

The static mixer-shaped partition structure 102 is electrically connected to the conductive layer 13 formed on the inner surface of the chemical liquid supply pipe 12 so that the electric charge generated due to friction between the partition structure 102 and the chemical liquid may be removed, the electric charge in the chemical liquid flowing in the chemical liquid supply pipe 12 may be efficiently removed, the electric charge may be uniformly generated according to a position of the chemical liquid, and the overall electric charge can be reduced.

The static mixer shape may be a conventional static mixer shape, and is not limited as long as the shape is a shape in which the chemical liquid inside the chemical liquid supply pipe can be uniformly mixed.

The partition structure 102 may be made of a second non-metallic conductive material, and the first non-metallic conductive material and the second non-metallic conductive material may each independently include at least one conductive polymer selected from the group consisting of polyaniline, polypyrrole, polythiophene, PEDOT, polycetylene, polyphenylene, and polyphenylenevinylene, or a conductive resin selected from the group consisting of carbon-containing PVDF, carbon-containing PEEK, carbon-containing PFA, and carbon-containing PTFE.

The carbon contained in the conductive resin may be a hard carbon material, which has a homogeneous and dense structure and is excellent in conductivity, chemical resistance, heat resistance, or the like. The carbon may be, for example, a carbon powder, a carbon nanotube, graphene, or graphite.

A content of carbon contained in the conductive resin may be 25 mass % or more and 35 mass % or less with respect to a total mass of the conductive resin. Alternatively, the content of carbon may be 28 mass % or more and 32 mass % or less. Alternatively, the content of carbon may be 30 mass % or more.

The chemical liquid supply pipe 12 according to the example embodiments of the present inventive concept may include the partition structure 102, which is electrically connected to the grounding conductor 104 grounded to the outside of the pipe 12 and includes the second non-metallic conductive material, so that the electric charge in the flowing chemical liquid may be reduced by increasing contact areas of the first non-metallic conductive material and the second non-metallic conductive material with the chemical liquid, the electric charge generated due to friction between the chemical liquid supply pipe 12 and a constant laminar flow of the chemical liquid may be reduced by mixing the chemical liquid flowing in a portion of the chemical liquid supply pipe 12 in contact with the chemical liquid flowing in the center portion and forming a turbulent flow, the electric charge may be uniformly generated according to the position of the chemical liquid in the chemical liquid supply pipe 12, and the overall electric charge can be reduced.

According to the example embodiments of the present inventive concept, during the supply of a chemical liquid for processing a semiconductor substrate, generation of an electric charge in the chemical liquid can be suppressed or the generated electric charge can be removed. Since the generation of the electric charge in the chemical liquid for processing a semiconductor substrate is suppressed or the electric charge is removed, adsorption of particles onto a substrate due to the electric charge of the chemical liquid can be suppressed or prevented and economic loss due to a drop in yield can be reduced. Since an apparatus configured to supply a chemical liquid for processing a semiconductor substrate may include a static electricity measurement sensor and a monitoring unit, the electric charge present in the chemical liquid can be measured and managed in real time, whether the electric charge in the chemical liquid for processing a semiconductor substrate accumulates, which may be caused by defective grounding or the like, can be monitored, and the adsorption of particles onto a substrate by the electric charge accumulated in the chemical liquid can be suppressed or prevented. Since a partition structure may be installed inside a chemical liquid supply pipe, the electric charge of the chemical liquid flowing in the pipe can be efficiently removed, the electric charge of the chemical liquid can be uniformly generated according to a position thereof in the pipe, and the overall electric charge in the chemical liquid can be reduced.

While the embodiments of the present inventive concept have been described with reference to the accompanying drawings, it should be understood by those skilled in the art that various modifications may be made without departing from the scope of the present inventive concept and without changing essential features. Therefore, the above-described embodiments should be considered in a descriptive sense only and not for purposes of limitation.

What is claimed is:

1. A chemical liquid supply apparatus comprising:
   a storage container configured to accommodate a chemical liquid for processing a substrate;
   a chemical liquid supply pipe connected to the storage container and having a conductive layer including a first non-metallic conductive material;
   a supply nozzle connected to the chemical liquid supply pipe, configured to supply the chemical liquid to the substrate, and including a second non-metallic conductive material;
   a static electricity measurement sensor passing through an outer wall of the chemical liquid supply pipe and configured to measure static electricity in the chemical liquid supply pipe; and
   a grounding conductor electrically connected to the conductive layer or the supply nozzle,
   wherein the conductive layer is formed on an inner surface of the chemical liquid supply pipe,
   wherein one end of the static electricity measurement sensor protrudes toward a center of the chemical liquid supply pipe.

2. The chemical liquid supply apparatus of claim 1, further comprising:
   a first layer comprising a non-conductive material and configured to surround the one end of the static electricity measurement sensor; and
   a second layer comprising a third non-metallic conductive material and formed on the first layer.

3. The chemical liquid supply apparatus of claim 2, further comprising an insulating layer formed between the second layer and the conductive layer including the first non-metallic conductive material.

4. The chemical liquid supply apparatus of claim 1, wherein the static electricity measurement sensor is a first static electricity measurement sensor, the apparatus further comprising a second static electricity measurement sensor passing through an outer wall of the supply nozzle and configured to measure static electricity in the supply nozzle.

5. The chemical liquid supply apparatus of claim 1, wherein the second non-metallic conductive material of the supply nozzle is electrically connected to the conductive layer of the chemical liquid supply pipe.

6. The chemical liquid supply apparatus of claim 1, wherein the second non-metallic conductive material of the supply nozzle is in direct contact with the conductive layer of the chemical liquid supply pipe.

7. The chemical liquid supply apparatus of claim 1, wherein the first non-metallic conductive material and the second non-metallic conductive material each include at least one conductive polymer selected from the group consisting of polyaniline, polypyrrole, polythiophene, poly(ethylenedioxy)thiophene (PEDOT), polyacetylene, polyphenylene, and polyphenylenevinylene, or a carbon-containing conductive resin selected from the group consisting of carbon-containing polyvinylidenefluoride (PVDF), carbon-containing polyetheretherketone (PEEK), carbon-containing perfluoroalkoxy (PFA), and carbon-containing polytetrafluoroethylene (PTFE).

8. The chemical liquid supply apparatus of claim 7, wherein the carbon is a carbon powder, a carbon nanotube, graphene, or graphite.

9. The chemical liquid supply apparatus of claim 7, wherein a content of carbon in the carbon-containing conductive resin is between 25 mass % and 35 mass % with respect to a total mass of the conductive resin.

10. A chemical liquid supply apparatus comprising:
    a storage container configured to accommodate a chemical liquid for processing a substrate;
    a chemical liquid supply pipe connected to the storage container and having a conductive layer including a first non-metallic conductive material;
    a supply nozzle connected to the chemical liquid supply pipe, configured to supply the chemical liquid to the substrate, and including a second non-metallic conductive material;
    a grounding conductor electrically connected to the conductive layer or the supply nozzle;
    a static electricity measurement sensor passing through an outer wall of the chemical liquid supply pipe and configured to measure static electricity in the chemical liquid supply pipe;
    a first layer comprising a first non-conductive material and surrounding one end of the static electricity measurement sensor; and
    a second layer comprising a third non-metallic conductive material on the first layer.

11. The chemical liquid supply apparatus of claim 10, further comprising an insulating layer between the conductive layer and the second layer.

12. The chemical liquid supply apparatus of claim 10, wherein the conductive layer is formed on an inner surface of the chemical liquid supply pipe.

13. The chemical liquid supply apparatus of claim 10, wherein the one end of the static electricity measurement sensor protrudes toward a center of the chemical liquid supply pipe.

* * * * *